United States Patent
Takebayashi et al.

(10) Patent No.: US 12,211,725 B2
(45) Date of Patent: Jan. 28, 2025

(54) ELECTROSTATIC CHUCK ASSEMBLY

(71) Applicant: NGK INSULATORS, LTD., Nagoya (JP)

(72) Inventors: Hiroshi Takebayashi, Handa (JP); Jyunya Waki, Handa (JP); Mitsuru Kojima, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 171 days.

(21) Appl. No.: 18/165,454

(22) Filed: Feb. 7, 2023

(65) Prior Publication Data
US 2024/0105488 A1 Mar. 28, 2024

Related U.S. Application Data

(63) Continuation of application No. PCT/JP2022/036288, filed on Sep. 28, 2022.

(51) Int. Cl.
*H01L 21/683* (2006.01)
*H01J 37/32* (2006.01)

(52) U.S. Cl.
CPC .... *H01L 21/6833* (2013.01); *H01J 37/32724* (2013.01); *H01J 2237/002* (2013.01); *H01J 2237/2007* (2013.01); *H01J 2237/334* (2013.01)

(58) Field of Classification Search
CPC .......................... H01L 21/6831; H01L 21/6833
See application file for complete search history.

(56) References Cited

U.S. PATENT DOCUMENTS

| 10,727,101 | B2 | 7/2020 | Yamamoto et al. |
| 2002/0036881 | A1 | 3/2002 | Shamouilian et al. |

(Continued)

FOREIGN PATENT DOCUMENTS

| JP | 2001-102436 A | 4/2001 |
| JP | 4590393 B2 | 12/2010 |

(Continued)

OTHER PUBLICATIONS

International Search Report and Written Opinion (Application No. PCT/JP2022/036288) dated Nov. 15, 2022.

(Continued)

*Primary Examiner* — Jared Fureman
*Assistant Examiner* — Christopher J Clark
(74) *Attorney, Agent, or Firm* — BURR PATENT LAW, PLLC

(57) ABSTRACT

There is provided an electrostatic chuck assembly including: an electrode-embedded ceramic plate; a cooling plate that supports a bottom surface of the ceramic plate and has an internal space of an annular or arcuate shape; an internal fixation member of an annular or arcuate shape accommodated in the internal space so as to be rotatable about a central axis of the cooling plate; female threads in a multiple of n, which is an integer of 2 or more, spaced apart from each other in the internal fixation member; and n insertion holes for insertion of bolts for being fixed to a chamber, the insertion holes each being provided at the bottom of the cooling plate such that one set of n female threads is exposed. Each of the female threads is disposed such that another set of n female threads is exposed in the insertion holes when rotated.

14 Claims, 8 Drawing Sheets

(56) References Cited

U.S. PATENT DOCUMENTS

2006/0279899 A1* 12/2006 Aihara ................ H01L 21/6831
                                                         361/234
2014/0209245 A1    7/2014 Yamamoto et al.
2024/0006226 A1*  1/2024 Kojima ............... H01L 21/6831

FOREIGN PATENT DOCUMENTS

| JP | 2013-113018 A | 6/2013 |
| JP | 2014-150104 A | 8/2014 |
| JP | 6080571 B2    | 2/2017 |

OTHER PUBLICATIONS

English translation of the International Search Report (Application No. PCT/JP2022/036288) dated Nov. 15, 2022.

* cited by examiner

ELECTROSTATIC CHUCK ASSEMBLY

CROSS-REFERENCE TO RELATED APPLICATION

This application is a continuation application of PCT/JP2022/036288 filed Sep. 28, 2022, the entire contents all of which are incorporated herein by reference.

BACKGROUND OF THE INVENTION

1. Field of the Invention

The present invention relates to an electrostatic chuck assembly.

2. Description of the Related Art

Circuit formation in semiconductor device fabrication is commonly performed by plasma etching. The plasma etching is performed by introducing an inert gas into a vacuum chamber in a plasma etching apparatus to turn the gas into plasma. In the plasma etching apparatus, an electrostatic chuck assembly is provided to function as a susceptor for mounting of a wafer to be etched. The electrostatic chuck assembly includes an electrode-embedded ceramic plate functioning as an electrostatic chuck and a cooling plate supporting a bottom surface of the electrode-embedded ceramic plate. A wafer is electrostatically attracted to the electrode-embedded ceramic plate, and plasma etching is performed while the wafer is fixed to the electrostatic chuck assembly. Meanwhile, the cooling plate is provided on the bottom surface of the electrode-embedded ceramic plate, thereby removing heat generated in the wafer due to the plasma etching. As a method of assembling the electrostatic chuck assembly into the vacuum chamber, fastening with bolts or screws has been employed.

Patent Literature 1 (JP4590393B) discloses a substrate retainer including: a ceramic base having a plurality of through holes; a plurality of cylindrical metal sockets inserted into the respective through holes and have bolt holes; a first brazing filler provided between the cylindrical metal socket and the through hole; a metal ring fitted to an outer circumferential sidewall of the ceramic base; and a second brazing filler provided between the metal ring and the outer circumferential sidewall of the ceramic base. An electrode for electrostatically chucking a substrate to be processed is provided inside the ceramic substrate. With such a configuration, it is said that damage caused by bolting can be reduced.

Patent Literature 2 (JP6080571B) discloses a mounting stand on which a workpiece is mounted, the mounting stand including: a base having a refrigerant flow path formed inside and a power supply member capable of applying a voltage connected to the back surface; a mounting material having a mounting surface on which a workpiece is mounted; a focus ring supported by the base; a first electric heating member interposed between the mounting surface and the refrigerant flow path; and a second electric heating member interposed between the focus ring and the refrigerant flow path. The base is supported by a support stand set at the bottom of the processing container. Specifically, the base and the support stand are positioned such that through holes in the support stand and the base overlap, and a screw is inserted from the back surface side of the support stand for screwing to connect and fix the base and the support stand.

CITATION LIST

Patent Literature

Patent Literature 1: JP4590393B
Patent Literature 2: JP6080571B

SUMMARY OF THE INVENTION

As described above, as a method of assembling the electrostatic chuck assembly into the vacuum chamber, fastening with bolts or screws has been employed. FIGS. 7 and 8 each illustrate a conventional structure for assembling an electrostatic chuck assembly 110 or 110' to a vacuum chamber 130. The conventional electrostatic chuck assembly 110 or 110' illustrated in each of FIGS. 7 and 8 either has an electrode-embedded ceramic plate 112, a cooling plate 114 supporting the bottom surface of the electrode-embedded ceramic plate, and a female thread 118. The female thread 118 illustrated in FIG. 7 has a structure in which a female thread shape is directly cut in the cooling plate 114. On the other hand, the female thread 118' illustrated in FIG. 8 has a female thread shape cut in an independent part 119 (separate from the cooling plate 114) (e.g., a nut) that is disposed in a hole in the cooling plate 114. Then, a bolt 122 inserted from the hole of the vacuum chamber 130 is screwed into the female thread 118 or 118' via an O-ring 132, whereby the electrostatic chuck assembly 110 or 110' is fixed to the vacuum chamber 130. However, there is a risk that the female thread 118 or 118' may deteriorate as the electrostatic chuck assembly 110 or 110' is assembled to or detached from the vacuum chamber 130, making the assembling impossible.

The inventors of the present invention have found that by employing a disk-shaped cooling plate with an annular or arcuate internal space and an annular or arcuate internal fixation member rotatably accommodated in the internal space and by providing female threads in a multiple of n in the internal fixation member such that the n female threads are exposed from the insertion holes on the back surface of the cooling plate, when at least one of the n female threads deteriorates, another set of n female threads having not deteriorated can be exposed from the insertion holes by simply rotating the internal fixation member, and as a result, the service life of the electrostatic chuck assembly can be increased multiplicatively.

Accordingly, it is an object of the present invention to provide an electrostatic chuck assembly capable of multiplicatively increasing its service life in use in a vacuum chamber.

The present invention provides the following aspects:

[Aspect 1]

An electrostatic chuck assembly comprising:
an electrode-embedded ceramic plate of a disc shape as an electrostatic chuck;
a cooling plate of a disc shape that supports a bottom surface of the electrode-embedded ceramic plate and has an internal space of an annular or arcuate shape;
an internal fixation member of an annular or arcuate shape accommodated in the internal space so as to be rotatable about a central axis of the cooling plate;
female threads in a multiple of n, where n is an integer of 2 or more, spaced apart from each other in the internal fixation member; and n insertion holes for insertion of bolts for being fixed to a chamber, the insertion holes each being provided at a bottom of the cooling plate such that one set of n of the female threads is exposed, wherein each of the female threads is disposed such that another set of n of the female threads is exposed in the insertion holes when the internal fixation member is rotated at a predetermined angle or at an angle being a multiple of the predetermined angle.

[Aspect 2]

The electrostatic chuck assembly according to aspect 1, wherein the n is from 2 to 24.

[Aspect 3]

The electrostatic chuck assembly according to aspect 1 or 2, wherein a total number of the female threads is two to five times the n.

[Aspect 4]

The electrostatic chuck assembly according to any one of aspects 1 to 3, wherein the n is 12, and a total number of the female threads is four times the n, that is 48.

[Aspect 5]

The electrostatic chuck assembly according to any one of aspects 1 to 4, wherein identification symbols are visibly provided next to the female threads of the internal fixation member, and wherein at least one of the n insertion holes has an excess opening that makes the identification symbols visible externally.

[Aspect 6]

The electrostatic chuck assembly according to aspect 5, wherein the insertion hole having the excess opening is an insertion hole of an arcuate shape.

[Aspect 7]

The electrostatic chuck assembly according to aspect 6, wherein there are two insertion holes each having the excess opening.

[Aspect 8]

The electrostatic chuck assembly according to aspect 7, wherein the two insertion holes each having the excess opening are disposed diagonally.

[Aspect 9]

The electrostatic chuck assembly according to any one of aspects 5 to 8, wherein the identification symbols are visibly provided in the internal fixation member by engraving.

[Aspect 10]

The electrostatic chuck assembly according to any one of aspects 5 to 9, wherein the same identification symbol is assigned to each of one set of the n female threads that can be simultaneously exposed in the insertion holes, and the identification symbol is different from an identification symbol assigned to each of another set of the n of female threads.

[Aspect 11]

The electrostatic chuck assembly according to aspect 10, wherein the identification symbols are numbers, and the numbers are each assigned to a respective one of the female threads such that the female threads are arranged in sequential order from 1 to m, where m is an integer of 2 or more and is a value obtained by dividing a total number of the female threads by the n.

[Aspect 12]

The electrostatic chucking assembly according to any one of aspects 6 to 11, wherein the internal fixation member is the member of the annular shape, and a central angle θ of an arc formed by the insertion hole of the arcuate shape is $[(360/N)+\theta_1]$ degrees or more, where N is a total number of the female threads, and $\theta_1$ is an angle formed by two tangent lines drawn from a center of the cooling plate to the female thread in a plan view.

[Aspect 13]

The electrostatic chuck assembly according to any one of aspects 6 to 12, wherein the internal fixation member includes two or more arcuate members each having a central angle of 360/n degrees or more, and in each of the arcuate members, a central angle θ of an arc formed by the insertion hole of the arcuate shape is $[(360/n)/N')+\theta_1]$ degrees or more, where N' is the number of the female threads in the arcuate member, and $\theta_1$ is an angle formed by two tangent lines drawn from a center of the cooling plate to the female thread in a plan view.

[Aspect 14]

The electrostatic chuck assembly according to any one of aspects 1 to 13, wherein the n female threads are equally spaced apart from each other.

DESCRIPTION OF EMBODIMENT

Electrostatic Chuck Assembly

Figure 1A:
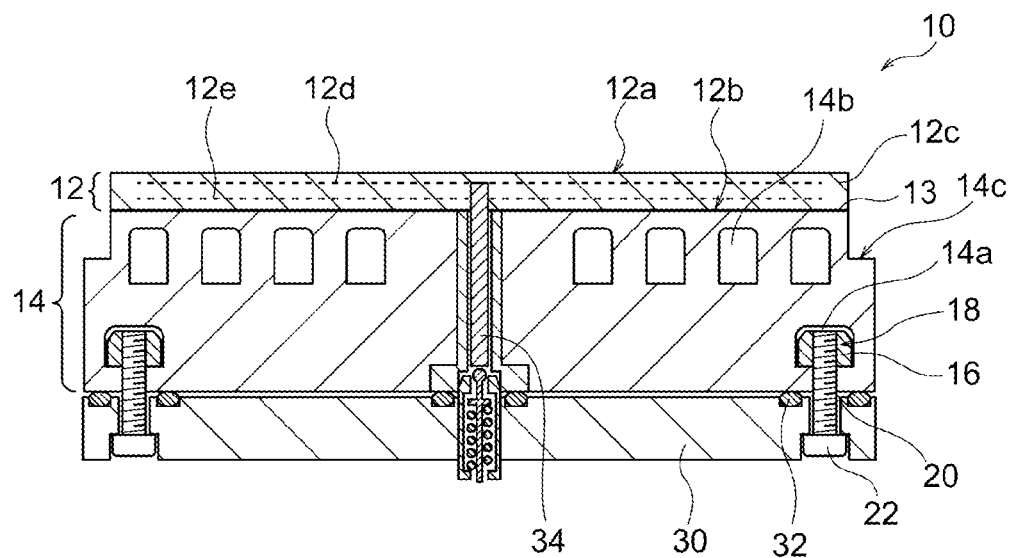
FIG. 1A is a schematic cross-sectional view of an example of an electrostatic chuck assembly according to the present invention.
Figure 1B:
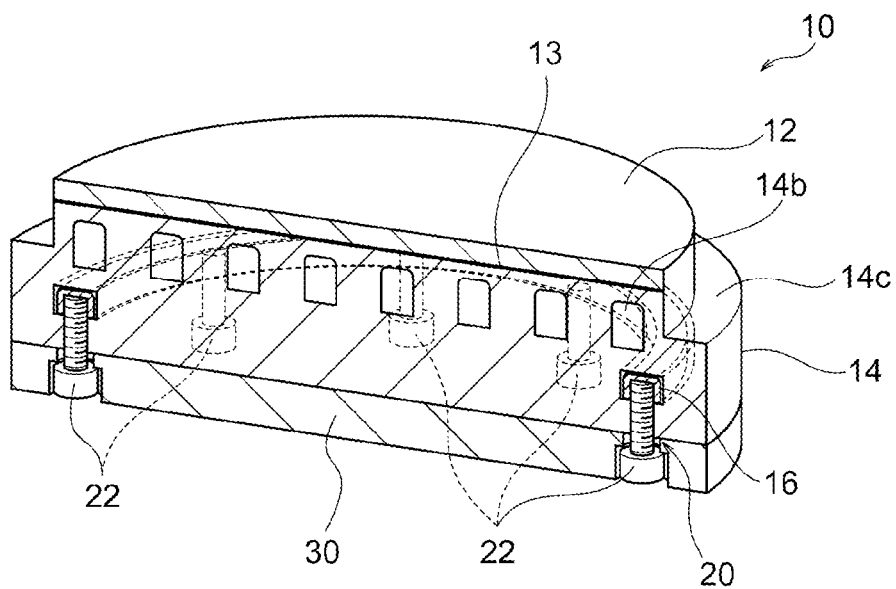
FIG. 1B is a cross-sectional perspective view of the electrostatic chuck assembly illustrated in FIG. 1A.
Figure 2A:
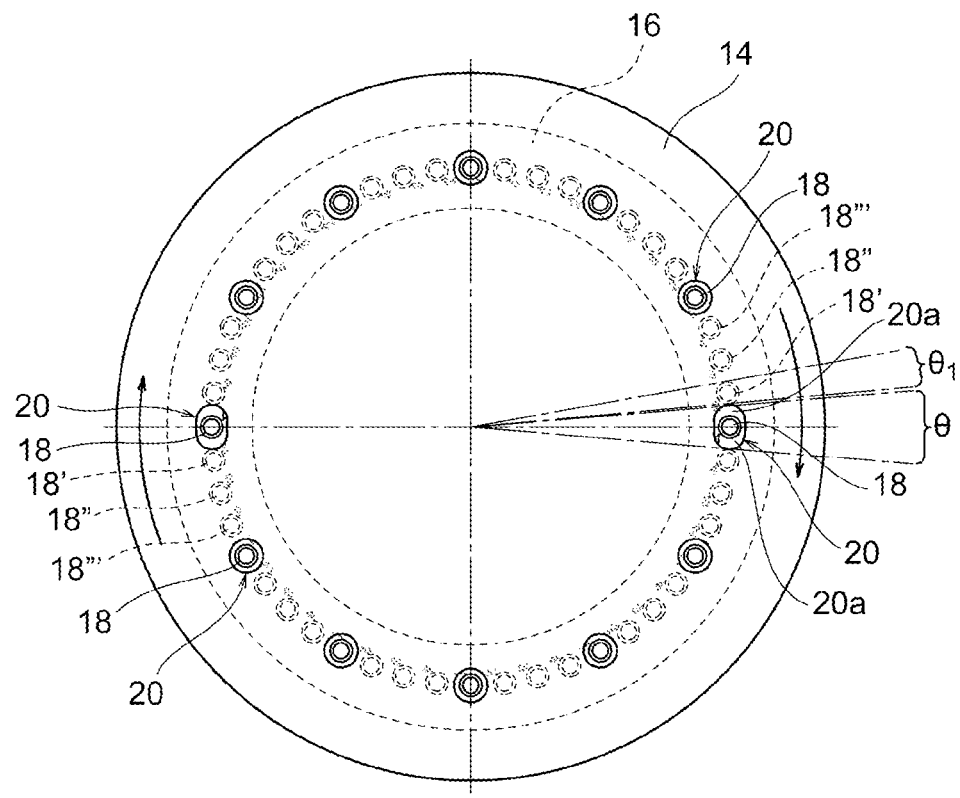
FIG. 2A is a schematic view of the electrostatic chuck assembly illustrated in FIG. 1A as viewed from a back surface of a cooling plate.

FIGS. 1A and 1B illustrate schematic cross-sectional views of an electrostatic chuck assembly 10 according to an aspect of the present invention. The electrostatic chuck assembly 10 includes an electrode-embedded ceramic plate 12, a disc-shaped cooling plate 14, an annular or arcuate internal fixation member 16, female threads 18, 18', 18", 18"', and insertion holes 20. The electrode-embedded ceramic plate 12 is a disk-shaped plate having a configuration as an electrostatic chuck. The cooling plate 14 is a disk-shaped plate with an annular or arcuate internal space 14a and supports the bottom surface of the electrode-embedded ceramic plate 12. The internal fixation member 16 is an annular or arcuate member that is accommodated in the internal space 14a so as to be rotatable about the central axis of the cooling plate 14. The female threads 18, 18', 18", 18''' are spaced apart from each other in the internal fixation member 16. The number of female threads 18, 18', 18", 18''' is a multiple of n (where n is an integer of 2 or more). The insertion holes 20 are holes for insertion of bolts 22 for being fixed to a chamber and are provided at the bottom of the cooling plate 14 such that one set of n female threads 18 is exposed, as illustrated in FIG. 2A, and hence the number of insertion holes 20 is n. Each of the female threads 18, 18', 18", 18''' is disposed such that another set of n female threads 18', 18", or 18''' is exposed in the insertion holes when the internal fixation member 16 is rotated at a predetermined angle or at an angle being a multiple of the predetermined angle. As thus described, by employing the disk-shaped cooling plate 14 with the annular or arcuate internal space 14a and the annular or arcuate internal fixation member 16 rotatably accommodated in the internal space 14a and by providing the female threads 18, 18', 18", 18''' in a multiple of n in the internal fixation member 16 such that the n female threads 18 are exposed from the insertion holes 20 on the back surface of the cooling plate 14, when at least one of the n female threads 18 deteriorates, another set of n female thread 18', 18", or 18''' having not deteriorated can be exposed from the insertion holes by simply rotating the internal fixation member 16, and as a result, the service life of the electrostatic chuck assembly can be increased multiplicatively.

That is, as described above, there has been a risk that the female thread 118 or 118' may deteriorate as the electrostatic chuck assembly 110 or 110' is assembled to or detached from the vacuum chamber 130, making the assembling impossible. However, even in such a case, the electrostatic chuck assembly 10 according to the present invention can sequentially expose the female thread 18', 18", or 18''' having not deteriorated in the insertion holes 20 by simply rotating the internal fixation member 16, so that the bolts 22 are re-screwed thereinto, and the electrostatic chuck assembly 10 can thereby continue to be used without being discarded. As a result, the service life of the electrostatic chuck assembly 10 can be increased multiplicatively (i.e., [(total number of female threads)/n] times, four times in the illustrated example).

Figure 7:
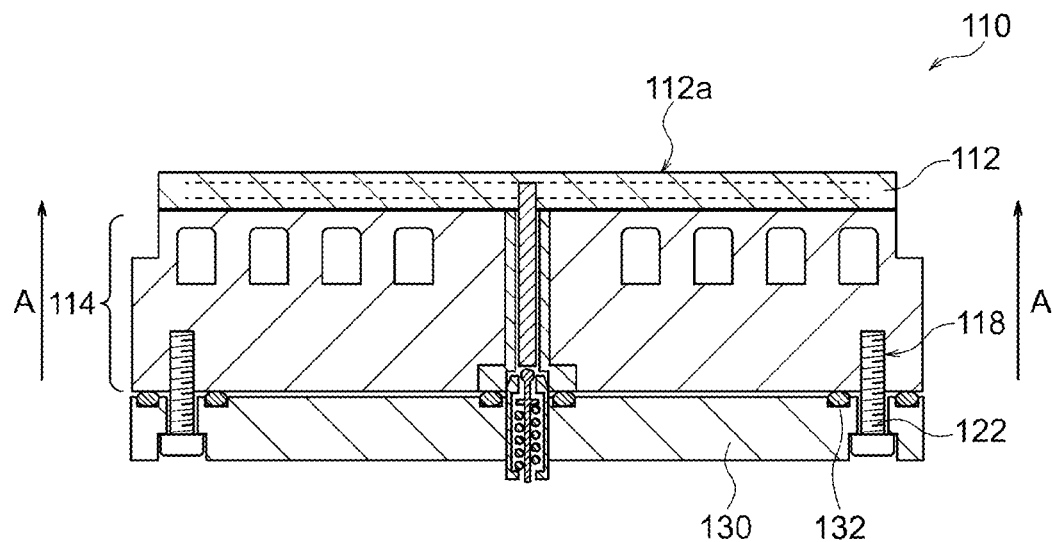
FIG. 7 is a cross-sectional view schematically illustrating an example of a conventional electrostatic chuck assembly.
Figure 8:
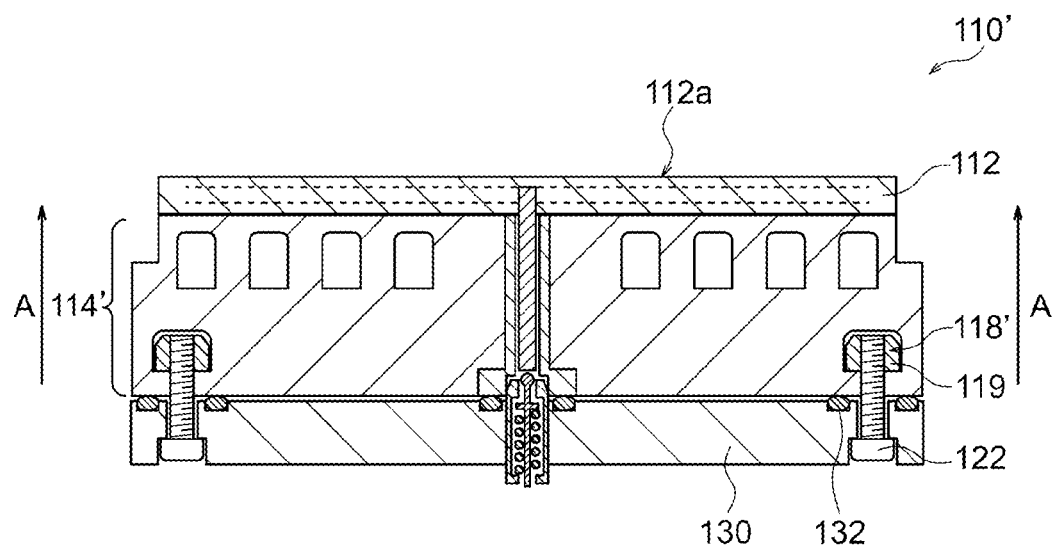
FIG. 8 is a cross-sectional view schematically illustrating another example of the conventional electrostatic chuck assembly.

The fact that the service life of the electrostatic chuck assembly 10 can be increased multiplicatively is extremely advantageous in view of the following circumstances in the vacuum chamber of the plasma etching apparatus. That is, in each of the conventional structures illustrated in FIGS. 7 and 8, torque applied to the bolt 122 for the assembling of the electrostatic chuck assembly 110 or 110' is desirably a value that ensures an axial force necessary for crushing the O-ring 132 between the back surface of the cooling plate 114 and the vacuum chamber 130 by a predetermined amount under an environment where atmospheric pressure is applied to the upper side in the vertical direction (in the direction of arrow A in each of the drawings). This value depends on the nominal diameters of the bolts 122 used for fixing and the number thereof, but in the case of, for example, 12 bolts of M6 (outer diameter 6 mm) made of a material of 2.4T series (e.g., carbon steel), as high as 1 Nm of torque can be applied. With the electrostatic chuck assembly 110 or 110' being subjected to repeated temperature rise and fall in use, not only the stress and reaction force generated at the time of the fixing of the bolt 122 but also the thermal stress caused by the temperature rise and fall is applied to a screw fixation part. For this reason, coupled with the conventional fixing methods as illustrated in FIGS. 7 and 8, it is easily assumed that biting and thread crushing (i.e., deterioration in the female thread 118 or 118') due to the interference between the screw threads will occur. In particular, even though the function of the electrostatic chuck assembly 110 or 110' as a susceptor itself has no problem after use, the service life as the susceptor may be limited due to the deterioration in the female thread 118 or 118', and hence there is an urgent need to improve the portion related to the female thread 118. It can thus be said that the problems associated with the deterioration in the female thread 118 or 118' as described above are particularly remarkable in the use in the vacuum chamber of the plasma etching apparatus, and the present invention can solve these problems successfully.

The electrostatic chuck assembly 10 of the present invention is also advantageous in being able to cope with the following problem in addition to the problems associated with the deterioration in the female thread 118 or 118'.

In each of the conventional structures illustrated in FIGS. 7 and 8, the portion fixed with the bolt 122 has a strong pulling force vertically downward as compared with the portion not fixed with the bolt 122, and hence there is also a problem that a surface 112a of the electrode-embedded ceramic plate 112 is likely to be uneven. In this regard, according to the present invention, clamping load due to the fixing of the bolt 122 is dispersed by the annular or arcuate internal fixation member 16, so that the unevenness of the surface 112a of the electrode-embedded ceramic plate 112 due to the assembling of the electrostatic chuck assembly 10 becomes less than in the conventional cases.

In the conventional structure illustrated in FIG. 8, a shape (e.g., hexagon like a nut, double chamfers, etc.) that restrains the rotation of the independent part 119 at the time of the fixing of the bolt 122 is required. However, when the independent part 119 is small, it is not possible to ensure large dimensions of the rotation restraining shape, and the rotation restraining effect becomes insufficient. Besides, when the rotation restraining shape is deformed, the fixing with the bolt 122 becomes impossible. In this regard, according to the present invention, with the internal fixation member 16 being annular or arcuate, the side surface of the internal fixation member 16 is restricted over a sufficient length by the inner wall of the annular or arcuate internal space 14a in the cooling plate 14, so that the rotation associated with the fixing of the bolt 122 can be restrained effectively.

The electrostatic chuck assembly 10 is used as a stand, on which a wafer is mounted, to perform chemical vapor deposition (CVD), etching, or the like on the wafer by using plasma and is fixed to a vacuum chamber 30 (particularly a lower part of the chamber) for manufacturing semiconductor devices.

The electrostatic chuck assembly 10 includes the electrode-embedded ceramic plate 12 and the cooling plate 14. The cooling plate 14 can be caused to adhere to a back surface 12b of the electrode-embedded ceramic plate 12 on the side opposite to a front surface 12a, which is the wafer mounting surface, via a bonding layer 13.

The electrode-embedded ceramic plate 12 may have a structure generally used as an electrostatic chuck. A typical electrode-embedded ceramic plate 12 includes a disk-shaped ceramic substrate 12c, and an electrostatic electrode 12d and a heater electrode 12e that are buried in the ceramic substrate 12c apart from each other in the thickness direction. In the ceramic substrate 12c, the electrostatic electrode 12d is provided near the front surface 12a, while the heater electrode 12e is provided near the back surface 12b. Examples of ceramic material constituting the ceramic substrate 12c include aluminum nitride, silicon carbide, silicon nitride, and aluminum oxide.

The electrostatic electrode 12d can be a conductive layer (e.g., a conductive mesh or plate) and is provided parallel to the front surface 12a. The back surface of the electrostatic electrode 12d passes through the vacuum chamber 30, the cooling plate 14, and the bonding layer 13, and is connected to a power supply rod 34 inserted into the ceramic substrate 12c. A DC voltage is applied to the electrostatic electrode 12d via the power supply rod 34.

The heater electrode 12e is made of a conductive coil or a printed pattern and is formed so as to be connected from one end to the other end in a manner of a single stroke across the entire electrode-embedded ceramic plate 12 in a plan view. One end and the other end of the heater electrode 12e pass through the vacuum chamber 30, the cooling plate 14, and the bonding layer 13 and are connected to a pair of power supply rods (not illustrated) inserted into the ceramic substrate 12c. A voltage is applied to the heater electrode 12e via the power supply rod.

However, the electrodes embedded in the ceramic substrate 12c are not limited to the electrostatic electrode 12d and the heater electrode 12e but may be other types of electrodes, and the number of layers of the electrodes embedded is not limited to two but may be three or more. For example, four layers of electrodes, which are an electrostatic electrode for a wafer, a bias electrode for a wafer, an electrostatic electrode for the focus ring, and a bias electrode for the focus ring, may be buried in the ceramic substrate 12c from the front surface 12a to the back surface 12b, the electrodes being spaced apart from each other in order.

The cooling plate 14 is a disk-shaped plate for supporting the bottom surface of the electrode-embedded ceramic plate 12 and has the annular or arcuate internal space 14a for accommodating the internal fixation member 16. The internal space 14a is formed in such a structure that the internal fixation member 16 can be accommodated so as to be rotatable about the central axis of the cooling plate 14. The cooling plate 14 may have a configuration of a cooling plate generally used for an electrostatic chuck, except that the cooling plate 14 has the internal space 14a. The cooling plate 14 may be made of a metal, such as aluminum or aluminum alloy, or a metal matrix composite (MMC) such as SiSiCTi (a composite material containing Si, SiC, and Ti). A typical cooling plate 14 is disk-shaped and has on its inside a flow path 14b through which a refrigerant can be circulated. The flow path 14b is connected to a refrigerant supply path and a refrigerant discharge path (not illustrated) that pass through the vacuum chamber 30, and the refrigerant discharged from the refrigerant discharge path is returned again to the refrigerant supply path after temperature adjustment. In the cooling plate 14, a lower portion of the cooling plate 14 (a portion on the side closer to the vacuum chamber 30) extends in a radially expanding direction to form a flange 14c.

The cooling plate 14 can be caused to adhere to the back surface 12b of the electrode-embedded ceramic plate 12 via the bonding layer 13. The bonding layer 13 may be a bonding sheet or a metal layer such as aluminum alloy layer. In particular, when the cooling plate 14 is made of a metal matrix composite (MMC) such as SiSiCTi, the cooling plate 14 is preferably bonded to the back surface 12b of the electrode-embedded ceramic plate 12 by thermal compression bonding (TCB). TCB refers to a known method in which a metal bonding material is sandwiched between two members to be bonded and the two members are pressure-bonded while being heated to a temperature equal to or lower than the solidus temperature of the metal bonding material. Examples of the metal bonding material include aluminum alloy.

Figure 3A:
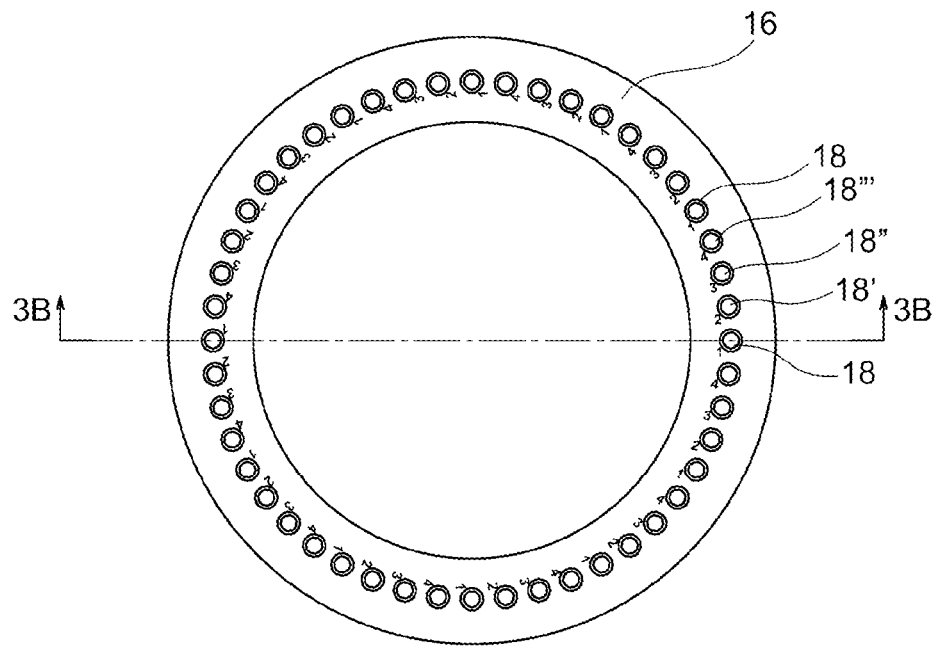
FIG. 3A is a bottom view illustrating an example of an internal fixation member used in the present invention.
Figure 3B:
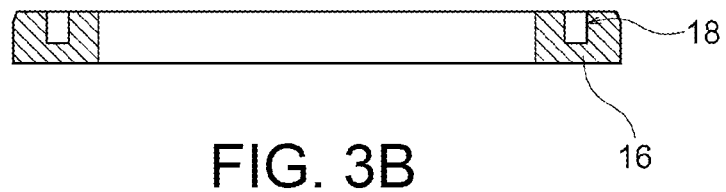
FIG. 3B is a 3B-3B cross-sectional view of the internal fixation member illustrated in FIG. 3A.
Figure 3C:
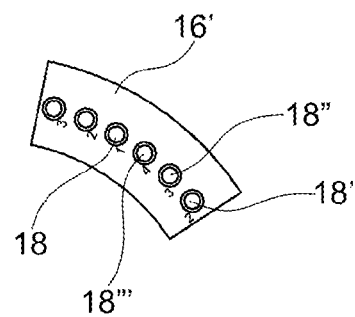
FIG. 3C is a bottom view illustrating another example of the internal fixation member used in the present invention.
Figure 3D:
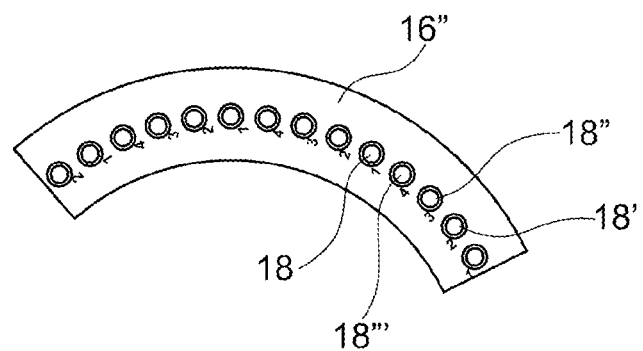
FIG. 3D is a bottom view illustrating another example of the internal fixation member used in the present invention.
Figure 3E:
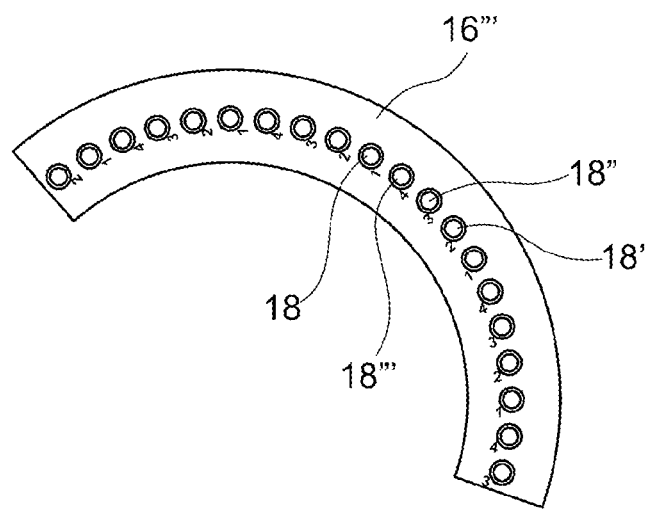
FIG. 3E is a bottom view illustrating another example of the internal fixation member used in the present invention.

The internal fixation member 16 is an annular or arcuate member that is accommodated in the internal space 14a so as to be rotatable about the central axis of the cooling plate 14. Thus, the internal fixation member 16 is formed in a shape suitable for the internal space 14a. The internal fixation member 16 may be annular as illustrated in FIGS. 2A, 3A, and 3B, or may be one of arcuate members 16', 16", and 16''' with various central angles as illustrated in FIGS. 3C to 3E. The central angles of the arcuate internal fixation member 16 illustrated in FIGS. 3C, 3D, and 3E are about 45°, about 90°, and about 135°, respectively. In the case where the internal fixation member 16 is formed into an arcuate shape, the internal space 14a of the cooling plate 14 may be annular or arcuate. When the internal space 14a of the cooling plate 14 is arcuate, it is desirable to make the arcuate central angle of the internal space 14a larger than the central angle of the arcuate internal fixation member 16 because the arcuate internal fixation member 16 needs to be accommodated in the internal space 14a so as to be rotatable about the central axis.

The internal fixation member 16 only needs to be made of a material capable of forming the female thread 18. Examples of such a material include metals such as titanium and stainless steel.

The female threads 18, 18', 18", 18''' are spaced apart from each other in the internal fixation member 16. The total number of female threads 18, 18', 18", 18''' is a multiple of n (where n is an integer of 2 or more). In this regard, in the aspect illustrated in FIGS. 2A and 3A, the number of female threads 18, the number of female threads 18', the number of female threads 18", and the number of female threads 18''' are each 12, that is, n=12, and the number of types of female threads 18, 18', 18", 18''' is four, so that the total number of female threads 18, 18', 18", 18''' is n×4=12×4=48. Note that the female threads 18, 18', 18", 18''' are preferably of the same shape and size as each other, and reference numerals 18, 18', 18", and 18''', which are different from each other, are merely provided for convenience of distinguishable description. However, the number of types and the total number of female threads 18, 18', 18", 18''' illustrated in FIGS. 2A and 3A are merely examples, and the present invention is not limited thereto.

The value of n is not particularly limited as long as being an integer of 2 or more, but the value of n is preferably 2 to 24, typically 3 to 20, and more typically 5 to 15. The total number of female threads 18, 18', 18", 18''' is preferably 2-5 times n. Most preferably, as illustrated in FIGS. 2A and 3A, the value of n is 12, and the total number of female threads 18, 18', 18", 18''' is four times n (i.e., 48). Preferably, the n female threads 18, 18', 18", 18''' are equally spaced apart from each other.

The insertion holes 20 are holes for insertion of the bolts 22 for being fixed to the chamber, and n insertion holes 20 are provided at the bottom of the cooling plate 14 such that one set of n female threads 18 is exposed. The insertion hole 20 is preferably formed to have a size slightly larger than the outer diameter of each of the female threads 18, 18', 18", 18''', so that the bolt 22 can be inserted into the female thread 18 without difficulty, except for a case where the insertion hole 20 has an excess opening 20a to be described later.

Each of the female threads 18, 18', 18'', 18''' is disposed such that another set of n female threads 18', 18'', or 18''' is exposed in the insertion holes 20 when the internal fixation member 16 is rotated at a predetermined angle or at an angle being a multiple of the predetermined angle. Another set of n female threads 18', 18'', or 18''' refers to a set of female threads (in the illustrated example, a combination of n female threads 18', a combination of n female threads 18'', or a combination of n female threads 18''') that can be simultaneously exposed in n insertion holes 20, in addition to the female threads (in the illustrated example, the female thread 18) already exposed in the insertion holes 20. In this manner, when the female thread 18 already exposed in the insertion hole 20 deteriorates due to use, an unused set of female threads 18', 18'', or 18''' can be exposed in the insertion holes 20 and newly used by simply rotating the internal fixation member 16 at a predetermined angle or at an angle being a multiple of the predetermined angle. That is, the bolt 22 can be screwed into a set of unused female threads 18', 18'', or 18'''. As a result, it is possible to multiplicatively increase the service life of the electrostatic chuck assembly 10 in use in the vacuum chamber.

It is preferable that identification symbols (1, 2, 3, and 4 in the illustrated example) be visibly provided next to the female threads 18, 18', 18'', 18''' of the internal fixation member 16 and that at least one of the n insertion holes 20 have an excess opening 20a that makes the identification symbol visible externally. In this manner, the used set of female threads 18 and the unused set of female threads 18', 18'', or 18''' can be distinguished from the excess opening 20a by the identification symbols, and the unused set of female threads 18', 18'', or 18''' to be exposed next to the insertion hole 20 can be selected in an easy and appropriate manner. It is thus preferable that the same identification symbol be assigned to each of one set of n female threads 18, 18', 18'', or 18''', which can be simultaneously exposed in the insertion holes 20, and that the identification symbol be different from an identification symbol assigned to each of another set of n female threads 18, 18', 18'', or 18'''. For example, as illustrated in FIGS. 2A and 3A, it is preferable that the identification symbols be numbers and that the numbers be assigned to the respective female threads 18, 18', 18'', 18''' such that the female threads 18, 18', 18'', 18''' are arranged in sequential order from 1 to m (where m is an integer of 2 or more and is a value obtained by dividing the total number of female threads by n). In this case, the female thread to be exposed in the insertion hole 20 may be determined in order according to the identification numbers. Preferably, the identification symbol is visibly provided in the internal fixation member 16 by engraving. The engraving is advantageous in that the identification symbol is hard to fade away even after a long period of use.

The insertion hole 20 with the excess opening 20a is preferably an arcuate insertion hole. There are preferably two insertion holes 20 with excess openings 20a, and these two insertion holes 20 with excess openings 20a are more preferably disposed diagonally.

Figure 2B:
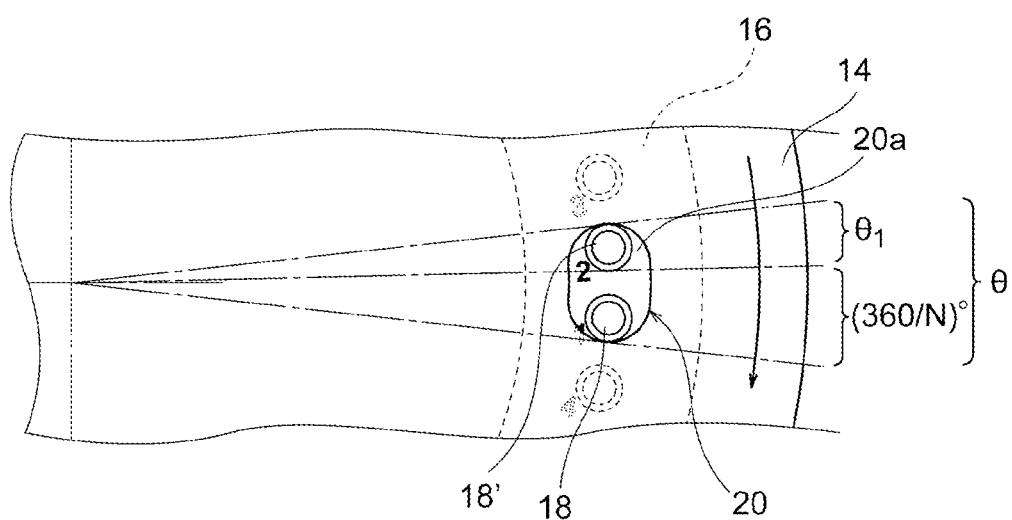
FIG. 2B is an enlarged view illustrating a state in which two female threads are exposed in insertion holes on the back surface of the cooling plate illustrated in FIG. 2A.

When the internal fixation member 16 is an annular member, as illustrated in FIG. 2B, a central angle θ of an arc formed by the arcuate insertion hole 20 (the insertion hole 20 with the excess opening 20a) is preferably $[(360/N)+\theta_1]$ degrees or more (where N is the total number of female threads 18, 18', 18'', 18''', and 81 is an angle formed by two tangent lines drawn from the center of the cooling plate 14 to the female thread 18, 18', 18'', or 18''' in a plan view). With this configuration, after the use of the female thread 18 is finished and the bolt 22 is removed, by simply inserting a rod or a finger into the female thread 18 and rotating the internal fixation member 16 about the central axis, the unused female thread 18', 18'', or 18''' to be used next can be easily exposed in the arcuate insertion hole 20 as illustrated in FIG. 2B. That is, not only the used female thread 18 but also the unused female thread 18', 18'', or 18''' can be exposed in the same arcuate insertion hole 20. In particular, since the internal fixation member 16 is accommodated in the internal space 14a of the cooling plate 14, and the portion where the internal fixation member 16 is exposed to the outside is only the portion corresponding to the insertion hole 20, ingenuity is required to rotate the internal fixation member 16, but according to the above aspect, the internal fixation member 16 can be rotated easily.

A similar approach can be applied to the arcuate member 16', 16'', or 16'''. In this case, the internal fixation member 16 includes two or more arcuate members 16', 16'', and/or 16''' with a central angle of 360/n degrees or more. In each of the arcuate members 16', 16'', and 16''', the central angle θ of the arc formed by the arcuate insertion hole 20 (the insertion hole 20 with the excess opening 20a) is preferably $[(360/n)/N')+\theta_1]$ degrees or more (where N' is the number of female threads in the arcuate member 16', 16'', or 16''', and $\theta_1$ is an angle formed by two tangent lines drawn from the center of the cooling plate to the female thread 18, 18', 18'', or 18''' in a plan view).

Manufacturing Method

The electrostatic chuck assembly of the present invention may be manufactured according to a known method, and the manufacturing method for the electrostatic chuck assembly is not particularly limited. For example, each of the electrode-embedded ceramic plate 12, the parts for the cooling plate 14, and the internal fixation member 16 is prepared, and these members are bonded by TCB, whereby the electrostatic chuck assembly 10 can be produced. Each step will be described below with reference to FIGS. 4 to 6.

(1) Preparation of Electrode-Embedded Ceramic Plate

Figure 4:
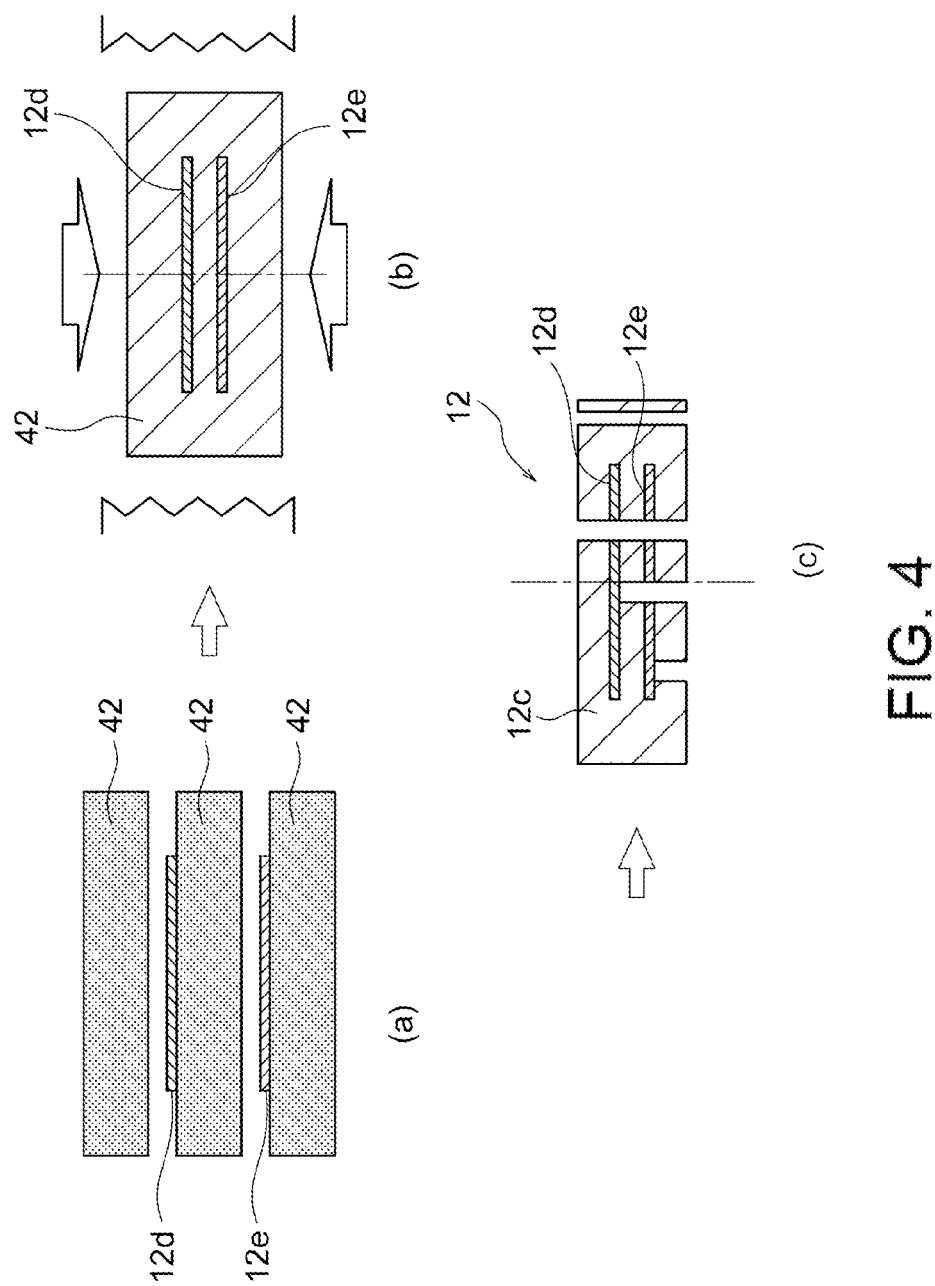
FIG. 4 is a flow chart illustrating a manufacturing process of an electrode-embedded ceramic plate used in the present invention.

First, a slurry containing ceramic raw material particles, a binder, a dispersant, and the like is prepared. Examples of the ceramic raw material particles include aluminum nitride particles, silicon carbide particles, silicon nitride particles, and aluminum oxide particles. The slurry is filtered, and a curing agent is added and mixed. The resulting slurry is poured into a mold and dried. A green sheet obtained by the drying is subjected to degreasing, calcination, and processing to obtain a disk-shaped green sheet 42. In FIG. 4, three green sheets 42 are prepared, but the number of green sheets 42 is not limited thereto, and four or more green sheets 42 may be used. Here, for convenience of description, it is assumed that three green sheets 42 are used.

As illustrated in FIG. 4(a), electrodes 12d or 12e are printed on two green sheets 42. Then, the three green sheets 42 are laminated such that the electrodes 12d, 12e are sandwiched between the green sheets 42. As illustrated in FIG. 4(b), the resulting laminate is fired by hot pressing. As illustrated in FIG. 4(c), the fired laminate is machined to form a hole connectable to the electrodes 12d, 12e. Thus, the electrode-embedded ceramic plate 12 is obtained.

(2) Preparation of Cooling Plate Parts

Figure 5:
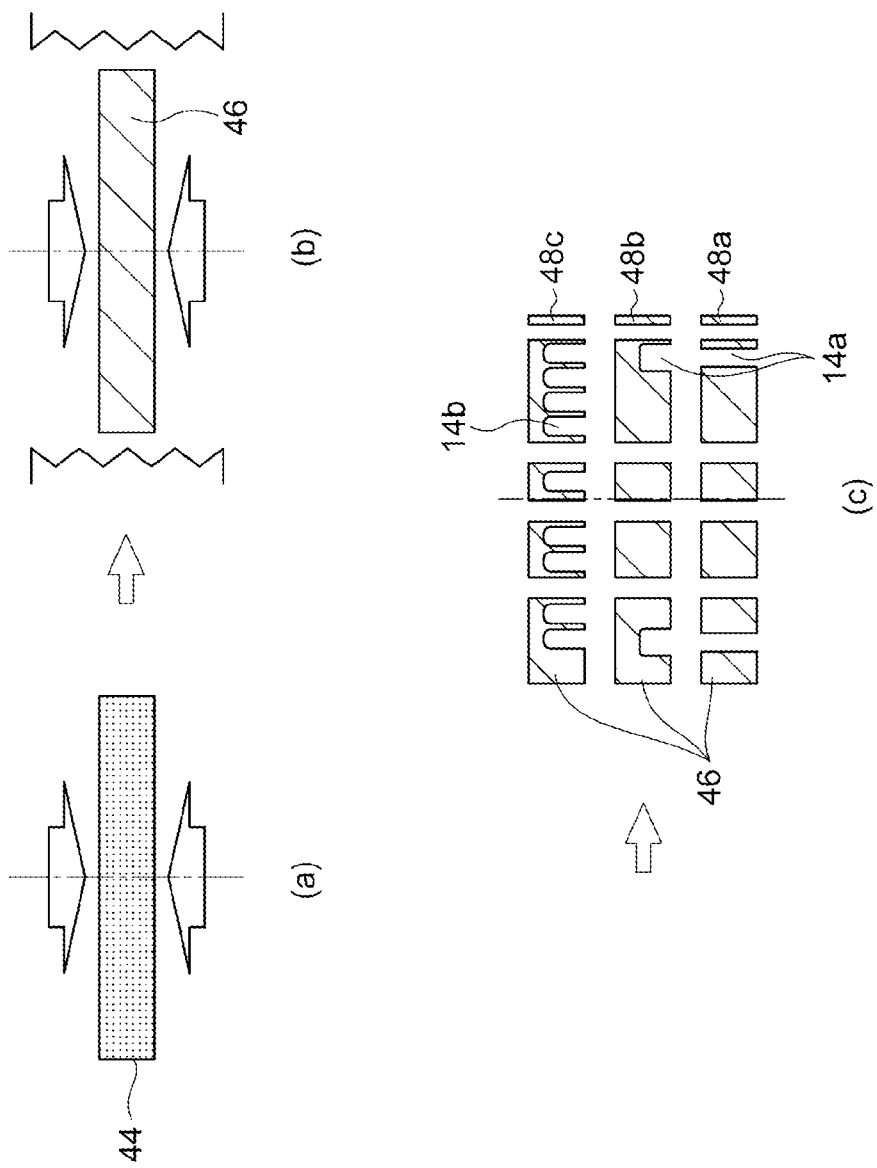
FIG. 5 is a flow chart illustrating the manufacturing process of the cooling plate used in the present invention.
Figure 6:
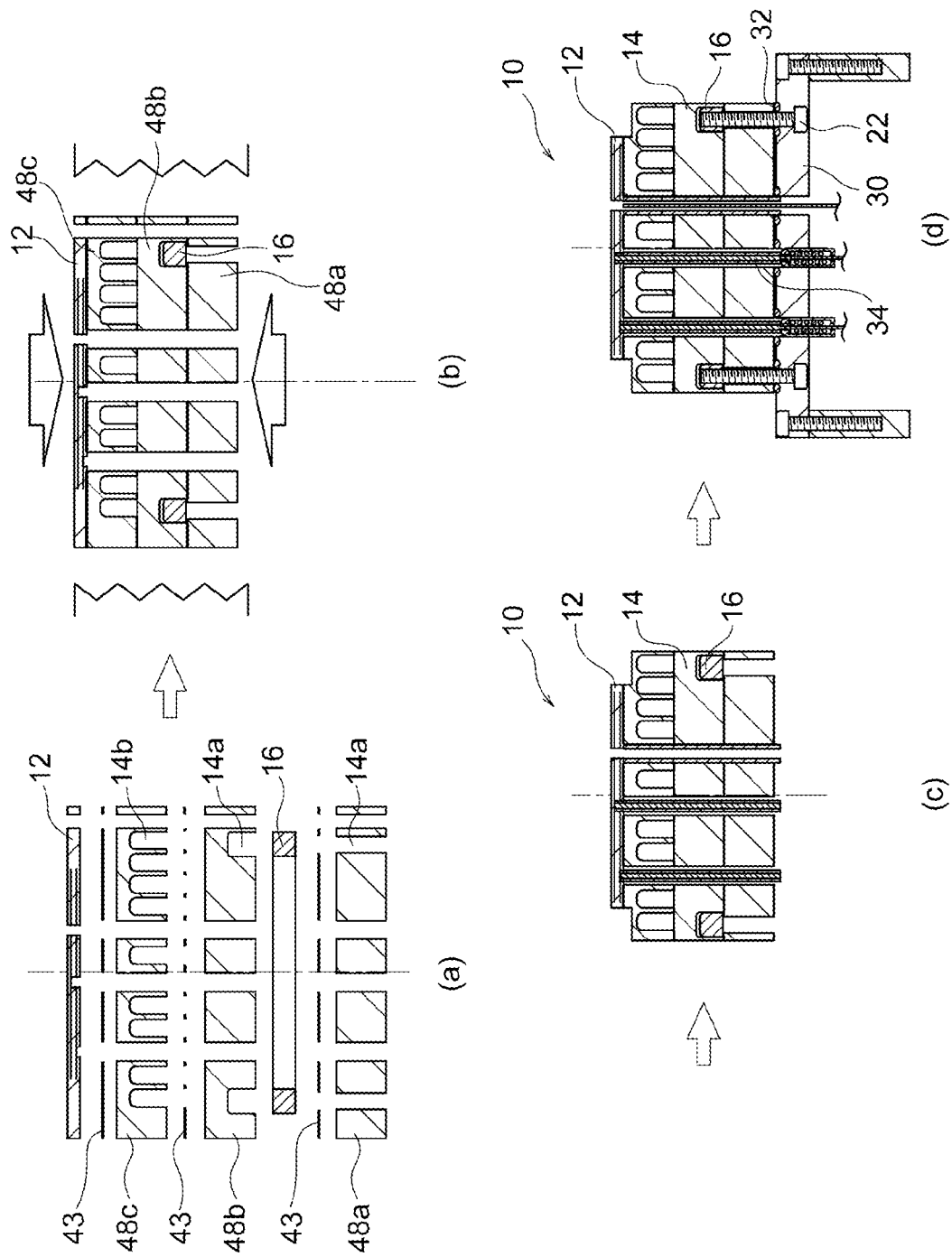
FIG. 6 is a flow chart illustrating a manufacturing process of the electrostatic chuck assembly according to the present invention and an assembling process of the electrostatic chuck assembly to a vacuum chamber.

As illustrated in FIG. 5(a), MMC raw material particles are press-molded to obtain a green compact 44, and thereafter, as illustrated in FIG. 5(b), the green compact 44 is fired by hot pressing. Thus, three MMC sintered bodies 46 are prepared. As illustrated in FIG. 5(c), each of the three MMC sintered bodies 46 is machined to form an internal space 14a and/or a flow path 14b. Thus, cooling plate parts 48a, 48b, 48c are obtained. Although three cooling plate parts 48a, 48b, 48c are prepared in FIG. 5, the number of cooling plate parts is not limited thereto, and four or more cooling plate parts may be used.

(3) Preparation of Internal Fixation Member

A material made of titanium is machined to obtain an annular internal fixation member 16 with equally spaced female threads 18, 18', 18'', or 18''' as illustrated in FIGS. 3A and 3B.

(4) Putting Together and Assembling of Electrostatic Chuck Assembly

As illustrated in FIG. 6(a), the electrode-embedded ceramic plate 12, the three cooling plate parts 48a, 48b, 48c, and the internal fixation member 16 are put together such that the internal fixation member 16 is accommodated in an internal space 14a. At this time, an aluminum alloy sheet 43 is interposed between the electrode-embedded ceramic plate 12 and the cooling plate part 48 and between the cooling plate parts 48. As illustrated in FIG. 6(b), TCB is performed to bond the electrode-embedded ceramic plate 12 and the cooling plate part 48c, and the cooling plate parts 48a, 48b, 48c to each other. As illustrated in FIG. 6(c), the resulting bonded body is subjected to additional machining, terminal bonding, thermal spraying, sleeve adhesion, and the like to obtain the electrostatic chuck assembly 10. Finally, as illustrated in FIG. 6(d), the electrostatic chuck assembly 10 is disposed in a vacuum chamber 30 with an O-ring 32 interposed therebetween, and a bolt 22 is penetrated through a hole in the vacuum chamber 30 (particularly its support plate) and inserted into the female thread 18 exposed in the insertion hole 20 for screwing. Thus, the electrostatic chuck assembly 10 is fixed to the vacuum chamber 30.

What is claimed is:

1. An electrostatic chuck assembly comprising:
   an electrode-embedded ceramic plate of a disc shape as an electrostatic chuck;
   a cooling plate of a disc shape that supports a bottom surface of the electrode-embedded ceramic plate and has an internal space of an annular or arcuate shape;
   an internal fixation member of an annular or arcuate shape accommodated in the internal space so as to be rotatable about a central axis of the cooling plate;
   female threads in a multiple of n, where n is an integer of 2 or more, spaced apart from each other in the internal fixation member; and
   n insertion holes for insertion of bolts for being fixed to a chamber, the insertion holes each being provided at a bottom of the cooling plate such that one set of n of the female threads is exposed,
   wherein each of the female threads is disposed such that another set of n of the female threads is exposed in the insertion holes when the internal fixation member is rotated at a predetermined angle or at an angle being a multiple of the predetermined angle.

2. The electrostatic chuck assembly according to claim 1, wherein the n is from 2 to 24.

3. The electrostatic chuck assembly according to claim 1, wherein a total number of the female threads is two to five times the n.

4. The electrostatic chuck assembly according to claim 1, wherein the n is 12, and a total number of the female threads is four times the n, that is 48.

5. The electrostatic chuck assembly according to claim 1,
   wherein identification symbols are visibly provided next to the female threads of the internal fixation member, and
   wherein at least one of the n insertion holes has an excess opening that makes the identification symbols visible externally.

6. The electrostatic chuck assembly according to claim 5, wherein the insertion hole having the excess opening is an insertion hole of an arcuate shape.

7. The electrostatic chuck assembly according to claim 6, wherein there are two insertion holes each having the excess opening.

8. The electrostatic chuck assembly according to claim 7, wherein the two insertion holes each having the excess opening are disposed diagonally.

9. The electrostatic chucking assembly according to claim 6, wherein the internal fixation member is the member of the annular shape, and a central angle θ of an arc formed by the insertion hole of the arcuate shape is [(360/N)+θ₁] degrees or more, where N is a total number of the female threads, and θ₁ is an angle formed by two tangent lines drawn from a center of the cooling plate to the female thread in a plan view.

10. The electrostatic chuck assembly according to claim 6, wherein the internal fixation member includes two or more arcuate members each having a central angle of 360/n degrees or more, and in each of the arcuate members, a central angle θ of an arc formed by the insertion hole of the arcuate shape is [(360/n)/N')+θ₁] degrees or more, where N' is the number of the female threads in the arcuate member, and θ₁ is an angle formed by two tangent lines drawn from a center of the cooling plate to the female thread in a plan view.

11. The electrostatic chuck assembly according to claim 5, wherein the identification symbols are visibly provided in the internal fixation member by engraving.

12. The electrostatic chuck assembly according to claim 5, wherein the same identification symbol is assigned to each of one set of the n female threads that can be simultaneously exposed in the insertion holes, and the identification symbol is different from an identification symbol assigned to each of another set of the n of female threads.

13. The electrostatic chuck assembly according to claim 12, wherein the identification symbols are numbers, and the numbers are each assigned to a respective one of the female threads such that the female threads are arranged in sequential order from 1 to m, where m is an integer of 2 or more and is a value obtained by dividing a total number of the female threads by the n.

14. The electrostatic chuck assembly according to claim 1, wherein the n female threads are equally spaced apart from each other.

* * * * *